(12) United States Patent
Mayuzumi

(10) Patent No.: US 6,841,472 B2
(45) Date of Patent: Jan. 11, 2005

(54) SEMICONDUCTOR DEVICE AND METHOD OF FABRICATING THE SAME

(75) Inventor: Satoru Mayuzumi, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/458,423

(22) Filed: Jun. 9, 2003

(65) Prior Publication Data

US 2003/0216022 A1 Nov. 20, 2003

Related U.S. Application Data

(62) Division of application No. 10/036,955, filed on Dec. 20, 2001.

(51) Int. Cl.⁷ ........................................... H01L 21/8244
(52) U.S. Cl. .................. 438/640; 438/43; 438/673; 438/701; 438/713; 438/760; 438/978
(58) Field of Search ................. 438/43, 640, 673, 438/701, 713, 978, FOR 458, FOR 492, 631, 760

(56) References Cited

U.S. PATENT DOCUMENTS

| | | | | |
|---|---|---|---|---|
| 5,231,038 A | * | 7/1993 | Yamaguchi et al. | 438/303 |
| 5,320,981 A | * | 6/1994 | Blalock | 438/640 |
| 5,734,185 A | * | 3/1998 | Iguchi et al. | 257/336 |
| 5,834,817 A | * | 11/1998 | Satoh et al. | 257/387 |
| 5,888,887 A | * | 3/1999 | Li et al. | 438/525 |
| 6,018,179 A | * | 1/2000 | Gardner et al. | 257/336 |
| 6,200,906 B1 | * | 3/2001 | Batra et al. | 438/708 |
| 6,204,538 B1 | * | 3/2001 | Kim | 257/371 |
| 6,337,244 B1 | * | 1/2002 | Prall et al. | 438/257 |
| 6,440,862 B1 | * | 8/2002 | Batra et al. | 438/708 |

FOREIGN PATENT DOCUMENTS

JP 7-038095 2/1995 ........... H01L/29/78

* cited by examiner

Primary Examiner—George Fourson
Assistant Examiner—Joannie Adelle Garcia
(74) Attorney, Agent, or Firm—Hayes Soloway P.C.

(57) ABSTRACT

A semiconductor device is provided with a semiconductor substrate, a gate insulation film formed on the semiconductor substrate, a gate electrode formed on the gate insulation film and having a portion increasing upward in the length along a gate length direction, a side wall formed on a side surface of the gate electrode so as to be covered behind a top part of the gate electrode as seen in plan view, and an interlayer insulation film covering the gate electrode. The side wall is in contact with the interlayer insulation film.

8 Claims, 8 Drawing Sheets

SEMICONDUCTOR DEVICE AND METHOD OF FABRICATING THE SAME

This application is a divisional application of U.S. application Ser. No. 10/036,955 filed Dec. 20, 2001.

BACKGROUND OF THE INVENTION

1. Field of the Invention

The present invention relates to a semiconductor device and a method of fabricating the same suited to a static random access memory (hereinafter, referred to as SRAM). In particular, the present invention relates to a semiconductor device and a method of fabricating the same for reducing the leak current of a field effect transistor (hereinafter, referred to as FET).

2. Description of the Related Art

For the sake of reduced cell areas, SRAM cells having such a structure that a single contact hole is shared among the gates of interconnected MOS transistors and the drain of another MOS transistor are now in use. FIG. 1 is a sectional view showing the structure of a conventional SRAM cell.

In this conventional SRAM cell, the drain of a first MOS transistor is connected with the gate of a second MOS transistor. A gate electrode 58 of the second MOS transistor is formed on a gate oxide film 57 on a silicon substrate 51. Side walls 59 are formed on the side surfaces of the gate electrode 58 and the gate oxide film 57. A low concentration diffusion layer 60a is formed at the surface of the silicon substrate 51 beneath the side wall 59 closer to the first MOS transistor. A high concentration diffusion layer 60b is formed outside the same. In addition, a silicide film 60c is formed on the high concentration diffusion layer 60b. Thereby is formed a drain region of the first MOS transistor.

An STI (Shallow Trench Isolation) oxide film 65 for element isolation is formed in the surface of the silicon substrate 51 beneath the side wall 59 farther from the first MOS transistor, so as to extend from outside the side wall 59 to under the gate oxide film 57. Moreover, a high concentration diffusion layer 60b and a silicide film 60c are formed in a region shown in FIG. 1 outside the oxide film 65 for element isolation, as in the drain region of the first MOS transistor. This portion makes part of a source region of the second MOS transistor (a high concentration region of an LDD (Lightly Doped Drain) structure). The gate electrode 58 makes a detour through a region not shown in FIG. 1 to a position across the source region from the portion shown in FIG. 1. A drain region (not shown) of the second MOS transistor is formed across the detouring portion of the gate electrode 58 from the source region.

Additionally, an interlayer insulation film 61 having a common contact hole 62a and a contact hole 62b is formed. The common contact hole 62a reaches the gate electrode 58 of the second MOS transistor and the drain-intended silicide film 60c of the first MOS transistor. The contact hole 62b reaches the source-intended silicide film 60c of the second MOS transistor. The common contact hole 62a is formed greater than the contact hole 62b by the size of the side wall 59. The common contact hole 62a and the contact hole 62b are filled with conductive films 63. Then, wiring layers 64 are formed on the conductive films 63, respectively. The wiring layers 64 consist of a lamination of, for example, a Ti film 64a, a TiN film 64b, an Al film 64c, a TiN film 64d, and a Ti film 64e.

According to the conventional SRAM cell configured thus, the gate and the drain share the same contact hole. This allows a reduction in cell area as compared to the case where the contact holes are provided separately.

To fabricate an SRAM cell having the above-described structure, however, it is necessary to form the gate electrode 58, the side walls 59, the silicide films 60c and the like on the silicon substrate 51 before the interlayer insulation film 61 is formed all over and the common contact hole 62a and the contact hole 62b are made therein. This means a problem because at that occasion, a side wall 59 might be removed off together with the interlayer insulation film 61. FIG. 2 is a sectional view showing the state after the formation of the common contact hole 62a and the contact hole 62b. As shown in FIG. 2, if the side wall 59 is removed, there can occur a leak current to the silicon substrate 51. The decrease of the side wall 59 may be suppressed by controlling the etching selectivity between the interlayer insulation film 61 and the side wall 59, whereas not as much as the leak is prevented.

As mentioned above, the common contact hole 62a is greater than the contact hole 62b by the size of the side wall 59. Therefore, the reduction in cell area is hardly adequate. Moreover, due to the different sizes of the contact holes, a resist film to be used as a mask for opening these holes is difficult to pattern.

Furthermore, there has been proposed a trench gate type MOSFET in which, for the sake of reduced switching delay time, a gate oxide film is formed along the bottom and sides of a trench, and a gate electrode shaped to increase in size upward is formed thereon (Japanese Patent Laid-Open Publication No. Hei 7-38095). Even in this case, the formation of a common contact hole inevitably exposes and etches the side wall.

SUMMARY OF THE INVENTION

An object of the present invention is to provide a semiconductor device and a method of fabricating the same capable of reducing the occurrence of a leak current due to a decrease of the side wall.

According to one aspect of the present invention, a semiconductor device comprises a semiconductor substrate, a gate insulation film formed on the semiconductor substrate, a gate electrode formed on the gate insulation film and having a portion increasing upward in the length along a gate length direction, a side wall formed on a side surface of the gate electrode so as to be covered behind a top part of the gate electrode as seen in plan view, and an interlayer insulation film covering the gate electrode and being in contact with the side wall.

According to another aspect of the present invention, a semiconductor device comprises a semiconductor substrate, a gate insulation film formed on the semiconductor substrate, a gate electrode formed on the gate insulation film and having a portion increasing upward in the length along a gate length direction, a side wall formed on a side surface of the gate electrode so as to be covered behind a top part of the gate electrode as seen in plan view, an interlayer insulation film covering the gate electrode, and a contact formed in the interlayer insulation film and being in contact with the side wall.

According to further another aspect of the invention, a semiconductor device comprises a semiconductor substrate, a gate insulation film formed on the semiconductor substrate, a gate electrode formed on the gate insulation film and having a portion increasing upward in the length along a gate length direction, and a side wall formed on a side surface of the gate electrode so as to be covered behind a top part of the gate electrode as seen in plan view. The side wall is formed of a lamination of at least two insulation films having different etching properties.

According to the present invention, the side wall is covered with the top part of the gate electrode. This can prevent the side wall from exposing to above even when a contact hole is etched in the interlayer insulation film during the forming steps. Therefore, the decrease of the side wall can be precluded for leakage prevention. Minimizing the top part to the limit of an exposure apparatus makes the bottom part still smaller, allowing a gate length smaller than the limit of the exposure apparatus. Consequently, the MOS transistors become capable of high-speed operation. In addition, since the side wall lies inside the upper part as seen in plan view, a further reduction is possible in the area of an SRAM cell that adopts the common contact hole structure.

When at least two insulation films having different etching properties are laminated to form the side wall, a tapered opening of desired shape can be formed easily. Therefore, a gate electrode of desired shape can be made in this opening.

According to still further another aspect of the present invention, a method of fabricating a semiconductor device comprises the steps of forming first and second insulation films on a semiconductor substrate in succession, forming an opening of tapered shape, narrowing with depth, in the second insulation film, forming an opening consistent with the bottom shape of the opening, in the first insulation film, burying a conductive film into the openings formed in the first and second insulation films to form a gate electrode, and etching the first and second insulation films with the conductive film as a mask to form a side wall on a side surface of the gate electrode so as to be covered behind a top part of the gate electrode as seen in plan view.

According to the method of the present invention, the first and second insulation films are etched with a conductive film as a mask. This allows a structure in which the conductive film makes the gate electrode and the first and second insulation films the side wall. Since the first and second insulation films are fully covered with the conductive film, the side wall is free from etching even in a subsequent step of forming a contact hole. In addition, the side wall can be formed in a self-aligning fashion, with a reduction in the number of steps.

The step of forming the first and second insulation films in succession may be preceded by the step of selectively forming an STI oxide film for element isolation, accompanied with the formation of a predetermined well and the ion implantation to a channel forming region.

DETAILED DESCRIPTION OF THE PREFERRED EMBODIMENT

Figure 1:
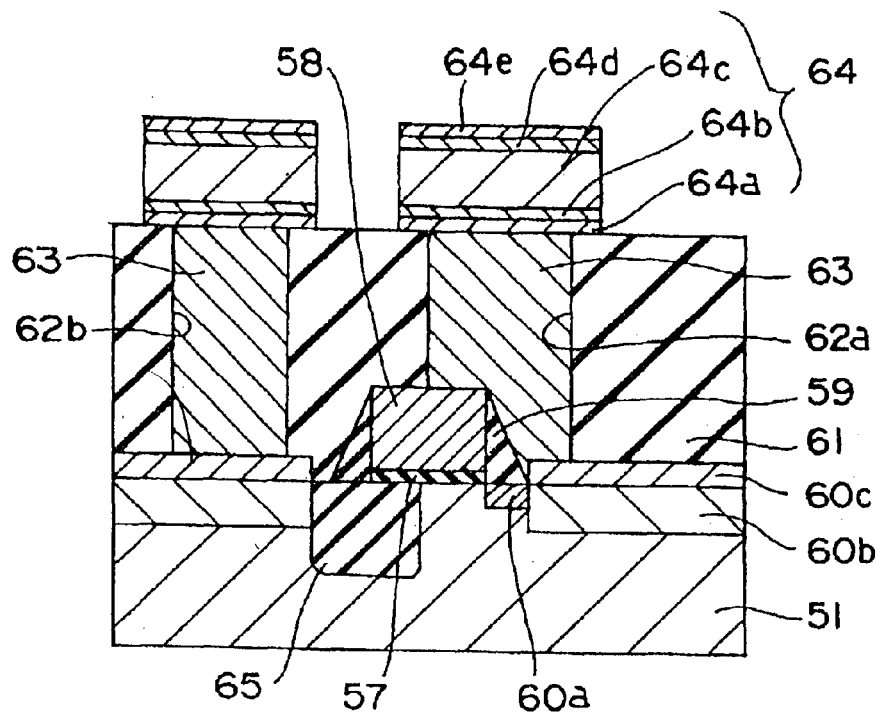
FIG. 1 is a sectional view showing the structure of a conventional SRAM cell.
Figure 2:
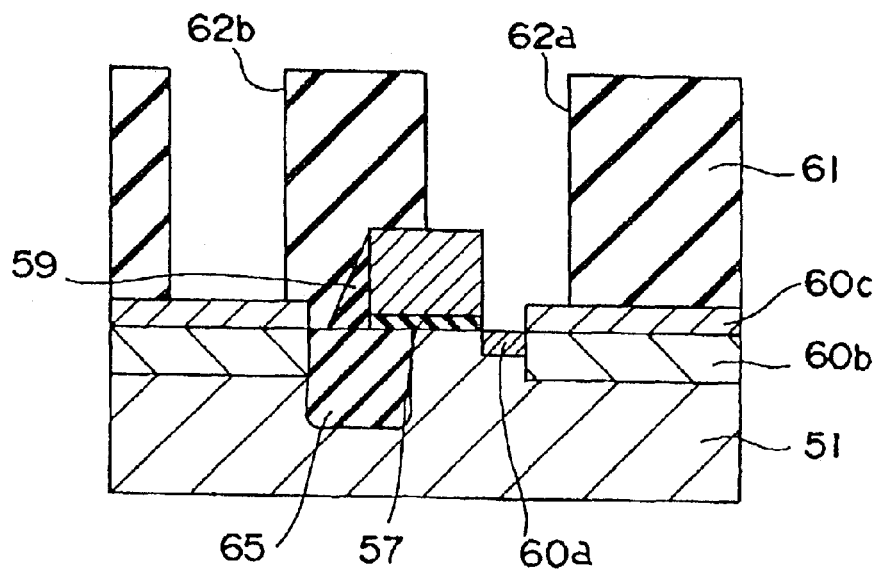
FIG. 2 is a sectional view showing the state after the formation of the common contact hole 62a and the contact hole 62b.
Figure 3A:
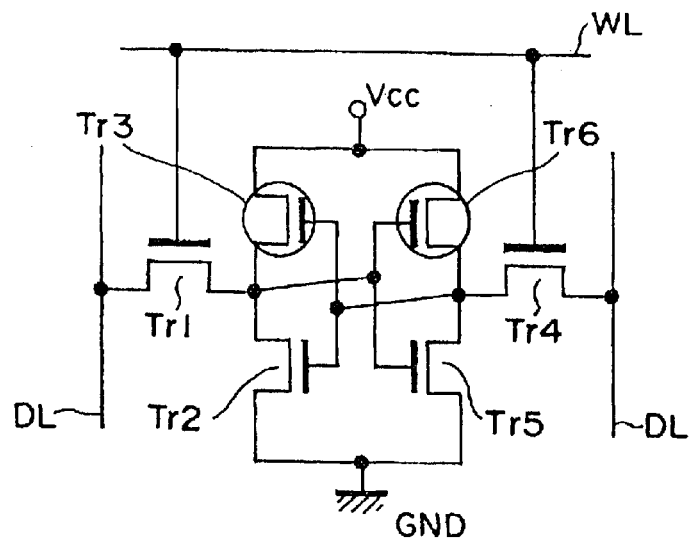
FIGS. 3A and 3B are a circuit diagram and a layout diagram showing a single cell in an SRAM according to an embodiment of the present invention, respectively.
Figure 3B:
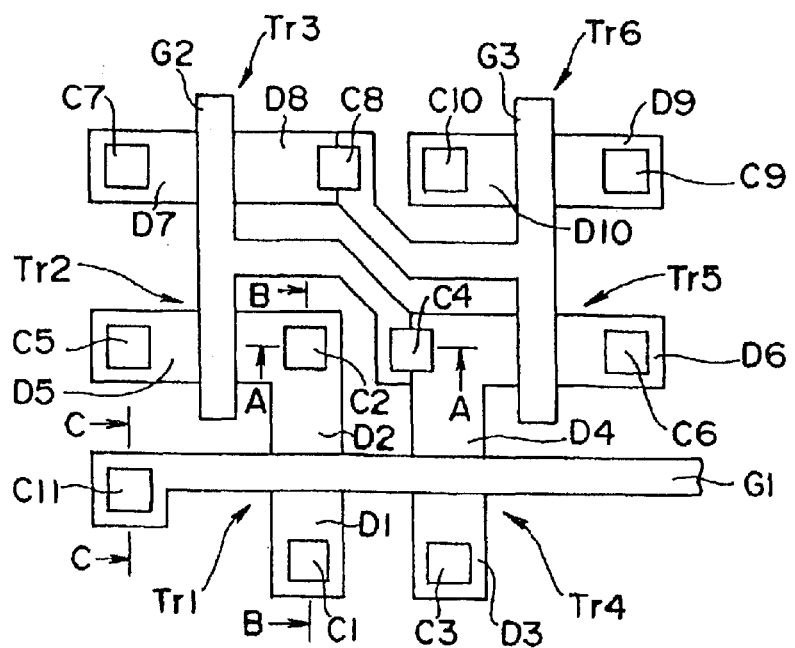
Figure 4:
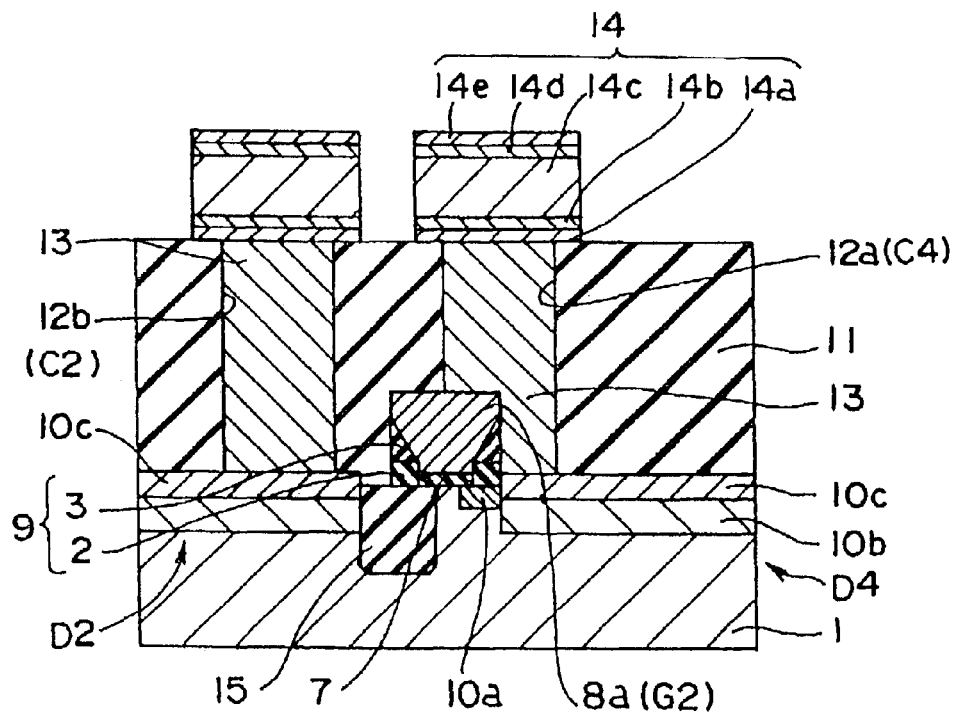
FIG. 4 is a sectional view taken along the line A—A of FIG. 3B.
Figure 5:
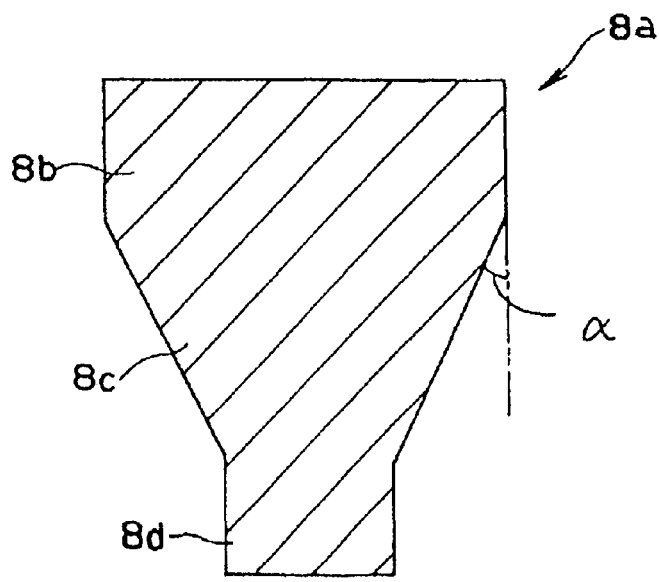
FIG. 5 is a sectional view showing the shape of a gate electrode according to the embodiment of the present invention as seen in a cross section orthogonal to the gate length direction.
Figure 6:
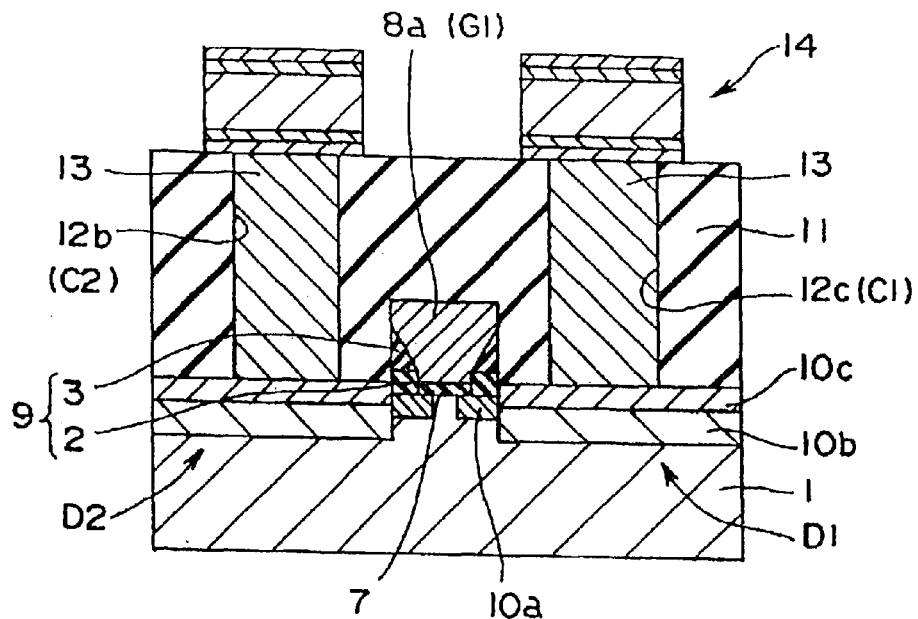
FIG. 6 is a sectional view taken along the line B—B of FIG. 3B.
Figure 7:
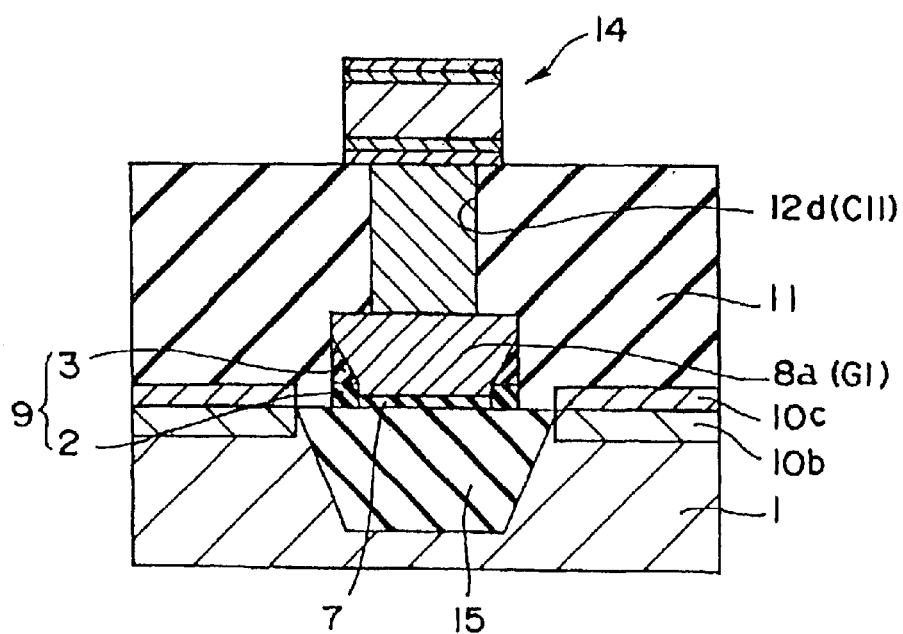
FIG. 7 is a sectional view taken along the line C—C of FIG. 3B.

Hereinafter, a preferred embodiment of the present invention will be described in detail with reference to the drawings. FIGS. 3A and 3B are a circuit diagram and a layout diagram showing a single cell in an SRAM according to the embodiment of the present invention, respectively. FIG. 4 is a sectional view taken along the line A—A of FIG. 3B. FIG. 5 is a sectional view showing the shape of a gate electrode according to the embodiment of the present invention as seen in a cross section orthogonal to the gate length direction. FIG. 6 is a sectional view taken along the line B—B of FIG. 3B. FIG. 7 is a sectional view taken along the line C—C of FIG. 3B.

In the present embodiment, as shown in FIG. 3A, a pair of data lines DL are connected with the sources of N-channel MOS transistors Tr1 and Tr4, respectively. The drains of the transistors Tr1 and Tr4 are connected to a word line WL. The source of the transistor Tr1 is connected with the drains of an N-channel MOS transistor Tr2 and a P-channel MOS transistor Tr3. The source of the transistor Tr4 is connected with the drains of an N-channel MOS transistor Tr5 and a P-channel MOS transistor Tr6. The sources of the transistors Tr2 and Tr5 are supplied with a ground voltage. The sources of the transistors Tr3 and Tr6 are supplied with a power supply voltage Vcc.

An SDRAM cell having the circuit configuration like the foregoing is realized, for example, in the layout shown in FIG. 3B. More specifically, N-type diffusion layers D1 and D2 intended for the transistor Tr1 are formed across a gate electrode G1 which extends in a row direction. N-type diffusion layers D3 and D4 intended for the transistor Tr4 are formed likewise. The N-type diffusion layer D2 is shared with the transistor Tr2. An N-type diffusion layer D5 intended for the transistor Tr2 is formed across a gate electrode G2, which extends in a column direction, from the N-type diffusion layer D2. Similarly, the N-type diffusion layer D4 is shared with the transistor Tr5. An N-type diffusion layer D6 intended for the transistor Tr5 is formed across a gate electrode G3, extending in the column direction, from the N-type diffusion layer D4. Moreover, P-type diffusion layers D7 and D8 intended for the transistor Tr3 are formed with the gate electrode G2 therebetween. P-type diffusion layers D9 and D10 intended for the transistor Tr6 are formed with the gate electrode G3 therebetween.

Contact holes C1 through C10 are made in an interlayer insulation film above the diffusion layers D1 through D10, respectively. The gate electrode G2 has an extension extended from the longitudinal central part thereof to the contact hole C4. The contact hole C4 for the N-type diffusion layer D4 is a common contact hole, being shared with the gate electrode G2. Similarly, the gate electrode G3 has an extension extended from the longitudinal central part thereof to the contact hole C8. The contact hole C8 for the P-type diffusion layer D8 is a common contact hole, being shared with the gate electrode G3. As for the gate electrode G1, a contact hole C11 is provided independently as will be described later. The N-type diffusion layer D2 and the P-type diffusion layer D8 are connected to each other by an upper wiring layer (not shown) through the contact holes C2 and C8. The N-type diffusion layer D4 and the P-type diffusion layer D10 are connected to each other by an upper wiring layer (not shown) through the contact holes C4 and C10. The diffusion layers D1 and D3 are connected to the data lines DL through the contact holes C1 and C3, respectively. The gate electrode G1 is connected to the word line WL through the contact hole C11. The N-type diffusion layers D5 and D6 are supplied with the ground voltage GND through the contact holes C5 and C6. The P-type diffusion layers D7 and D9 are supplied with the power supply voltage Vcc through the contact holes C7 and C9.

In the region where the transistor Tr2 and the transistor Tr5 come close to, as shown in FIG. 4, a gate electrode 8a (the extension of the gate electrode G2) is formed on a gate oxide film 7 on a silicon substrate 1. The gate electrode 8a, as shown in FIG. 5, has a three-stage structure consisting of a visor part 8b, an upper part 8c, and a lower part 8d. The visor part 8b is rectangular in section, and has dimensions of, for example, 40 nm in height and 140 nm in width. The lower part 8d is also rectangular in section, and has dimensions of, for example, 40 nm in height and 50 nm in width. The upper part 8c is isosceles-trapezoidal in section, shorter at the bottom. As for dimensions, the upper part 8c has, for example, a top side of 140 nm, a bottom side of 50 nm, and a height of 80 nm. The sides of the visor part 8b and the sides of the upper part 8c form an angle (taper angle) $\alpha$ on the order of about 30°.

Insulation films 3 are formed on the side surfaces of the upper part 8c so as to be covered with the visor part 8b. Insulation films 2 are formed on the side surfaces of the lower part 8d and the gate oxide film 7 so as to be covered with the visor part 8b. These insulation films 3 and 2 constitute side wall 9.

A low concentration diffusion layer 10a is formed at the surface of the silicon substrate 1 beneath the insulation film 2 closer to the transistor Tr5. A high concentration diffusion layer 10b is formed outside the same. In addition, a silicide film 10c is formed on the high concentration diffusion layer 10b. The low concentration diffusion layer 10a, the high concentration diffusion layer 10b, and the silicide film 10c make a source/drain region (N-type diffusion layer D4) of LDD structure.

An STI oxide film 15 for element isolation is formed at the surface of the silicon substrate 1 beneath the insulation film 2 farther from the transistor Tr5, so as to extend from outside the insulation film 2 to under the gate oxide film 7. Besides, a high concentration diffusion layer 10b and a silicide film 10c are formed in a region shown in FIG. 4 outside the oxide film 15 for element isolation, as in the drain region of the transistor Tr5. This portion makes part of a source region of the transistor Tr2 (high concentration region of LDD structure). As shown in FIG. 3B, the gate electrode 8a makes a detour to a position across the source region (N-type diffusion layer D2) from the portion shown in FIG. 4. The drain region of the transistor Tr2 (N-type diffusion layer D5) is formed across the detouring region of the gate electrode 8a from the source region (N-type diffusion layer D2).

In addition, an interlayer insulation film 11 having a common contact hole 12a and a contact hole 12b is formed. The common contact hole 12a reaches the gate electrode 8a and the silicide film 10c of the N-type diffusion layer D4. The contact hole 12b reaches the silicide film 10c of the N-type diffusion layer D2. The common contact hole 12a and the contact hole 12b are buried with conductive films 13 of Al, Cu, or the like. Then, wiring layers 14 are formed on the conductive films 13, respectively. The wiring layers 14 are made of a lamination of, for example, a Ti film 14a, a TiN film 14b, an Al film 14c, a TiN film 14d, and a Ti film 14e. The Al film 14c may be replaced with a Cu film.

The region where the transistors Tr3 and Tr6 come close to has the same structure except for the inverted conductive types of the diffusion layers and the like. Side walls are also formed in the other portions of the gate electrodes G2 and G3, so as to be covered with visor parts as in the extensions described above.

Meanwhile, as shown in FIG. 6, the transistors Tr1 and Tr4 are configured substantially identical to the transistors Tr2, Tr3, Tr5, and Tr6 except in the structure for connecting the wiring layers 14 on the interlayer insulation film 11 to the gate electrodes and diffusion layers. That is, as shown in FIG. 6, there is formed no common contact hole 12a. A contact hole 12c reaching the silicide film 10c of the N-type diffusion layer D1 alone is formed in a position across the gate electrode 8a from the contact hole 12b. In addition, as shown in FIG. 7, a contact hole 12d reaching the gate electrode 8a alone is formed in a position away from the source/drain region. Incidentally, the gate electrode 8a is provided with a hammer-headed formed under the contact hole 12d. In the hammer-headed region, an STI oxide film 15 for element isolation is formed at the surface of the silicon substrate 1 beneath the insulation films 2 and the gate electrode 7.

According to the SRAM of the present embodiment configured thus, no side wall lies outside the visor parts 8b as seen in plan view. Therefore, the common contact holes 12a can be rendered nearly equal to the contact holes 12b in size. This allows a further reduction in cell area. Moreover, each visor part maces contact with the conductive film 13 not only at its top but also at its side, thereby reducing the contact resistance.

Incidentally, such transistors provided with a gate electrode having a portion increasing in the length along the gate length direction and side walls formed on side surfaces of the gate electrode so as to be covered behind the top part of the gate electrode as seen in plan view can be used not only in SRAM cells as of the present embodiment but also in logic circuits and the like, in the same fashion as with conventional MOSFETs.

Now, description will be given of a method of fabricating the transistors Tr2, Tr3, Tr5, and Tr6 in the embodiment described above. FIGS. 8A through 8I are sectional views showing, in order of steps, the method of fabricating a semiconductor device according to the embodiment of the present invention. Incidentally, a region shown in FIGS. 8A through 8I corresponds to a region shown in FIG. 4.

First, as shown in FIG. 8, an STI oxide film 15 for element isolation is selectively formed at the surface of a silicon substrate 1, followed by the formation of a predetermined well (not shown) and the ion implantation to a channel forming region (not shown). Then, insulation films 2, 3, and 4 are formed on the silicon substrate 1 in succession. The insulation film 2 is made of such a material as $SiO_2$, and has a thickness of, for example, 40 nm. The insulation film 3 is made of such a material as $Si_3N_4$, SiON, or SiC, and has a thickness of, for example, 80 nm. The insulation film 4 is made of such a material as $SiO_2$ and BPSG (Boron-doped Phosphor-Silicate Glass), and has a thickness of, for example, 140 nm. A resist film 5 is formed on the insulation film 4. This resist film 5 is provided with an opening 5a which has the same width (for example, 140 nm) as that of the visor part 8b of the gate electrode 8a. The insulation film 4 is then etched with the resist film 5 as a mask, so that an opening 4a is formed in the insulation film 4. Here, mixed gas of, for example, $C_4F_8$, $O_2$, and Ar can be used as the etching gas.

Figure 8A:
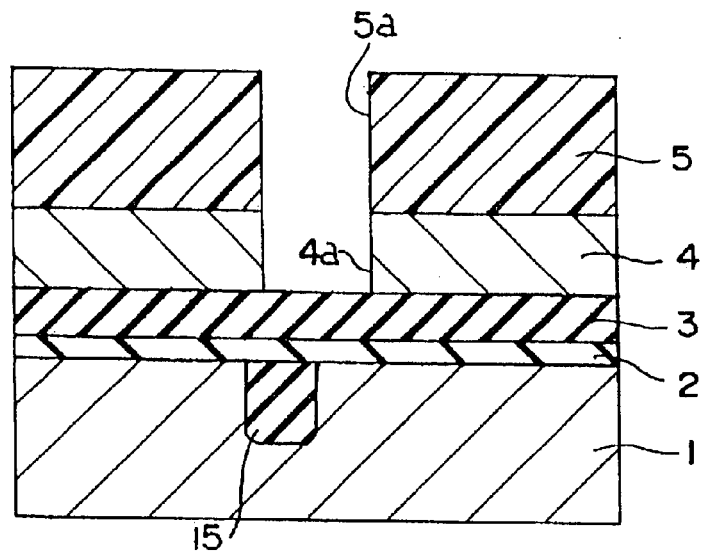
FIGS. 8A through 8I are sectional views showing, in order of steps, a method of fabricating a semiconductor device according to the embodiment of the present invention.
Figure 8B:
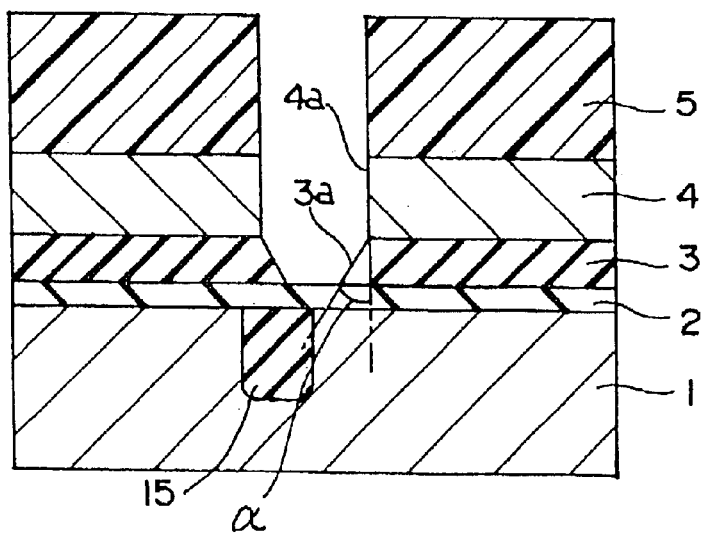

Then, as shown in FIG. 8B, the insulation film 3 is etched with the insulation film 4 as a mask, so that an opening 3a of tapered shape, narrowing with depth, is formed in the insulation film 3. Here, mixed gas of, for example, $CHF_3$, CO, and $O_2$ can be used as the etching gas when the insulation film 3 is made of $Si_3N_4$. Mixed gas of, for example, $CHF_3$, $O_2$, and Ar can be used when the insulation film 3 is made of SiON or SiC. The use of the $CHF_3$-containing etching gases effects the etching and, at the same time, forms a deposition around the newly-formed opening. This allows the formation of the tapered opening 3a. Incidentally, when the insulation film 3 is made of $Si_3N_4$, the rates for the individual gases, or $CHF_3$, CO, and $O_2$, to flow with in normal conditions are, for example, 10–30 ml/min, 140–350 ml/min, and 10–50 ml/min, respectively. At such rates of flow, the side walls of the opening 3a and the side walls of the opening 4a form an angle (taper angle) α on the order of, for example, 30–60°. When the opening 5a is 140 nm in width, the opening 3a formed at a taper angle of 30° has a width of approximately 50 nm at the bottom. The bottom width of the opening 3a preferably within the range of 50–80 nm or so. The rates of flow of CO and $O_2$ in the etching gas can be increased to make the side walls of the opening 3a incline gentler. The taper angle α may be increased up to around 60°. Note that when the taper angle is increased, the opening 3a can be too small in the bottom width. Therefore, the opening 5a sometimes needs to be formed somewhat greater in advance so as to make an opening 2a to required size.

Figure 8C:
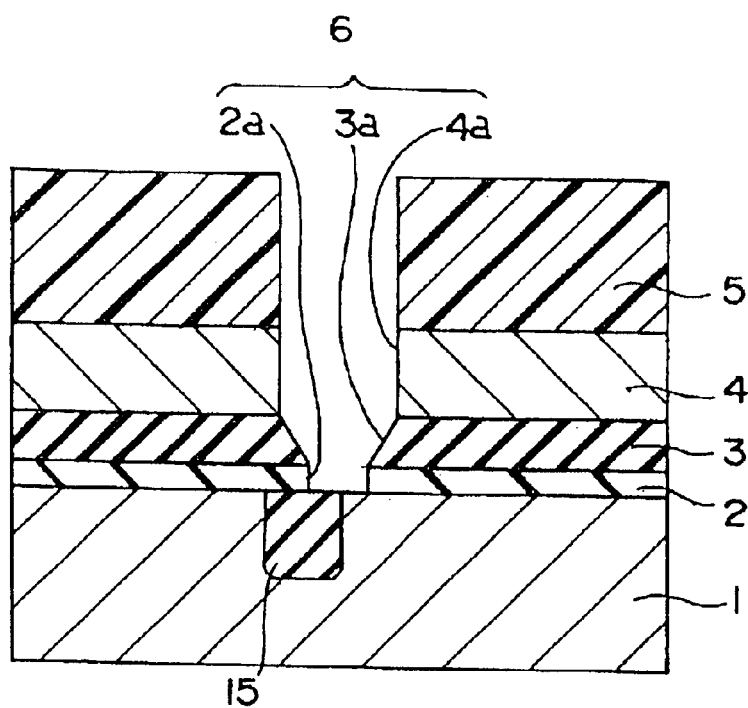

Next, as shown in FIG. 8C, the insulation film 2 is etched with the insulation film 3 as a mask, so that the opening 2a is formed in the insulation film 2. As a result, a trench 6 consisting of the openings 2a, 3a, and 4a is formed. Here, mixed gas of, for example, $C_4F_8$, $O_2$, and Ar can be used as the etching gas.

Figure 8D:
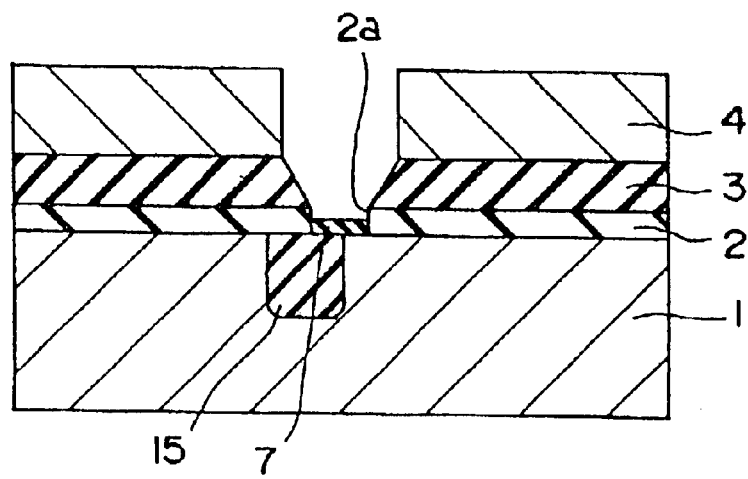

Subsequently, as shown in FIG. 8D, the resist film 5 is removed off. A gate oxide film 7 is formed all over. The gate oxide film 7 is made of such a material as $SiO_2$, SiON, $HfO_2$, $ZrO_2$, or $Al_2O_3$. Before the formation of the gate oxide film 7, it is preferable that the surface of the silicon substrate 1 exposed in the opening 2a have undergone thermal oxidization into a depth of the order of 8 nm to form a sacrificial oxide film (not shown) and this sacrificial oxide film have been removed off by wet etching using a buffered fluoric acid of reduced etching rate. Due to the formation and removal of such a sacrificial oxide film, damage on the surface of the silicon substrate 1 is eliminated if it has caused by the dry etching in forming the opening 2a. Incidentally, in FIG. 8D, the gate oxide film 7 is shown inside the opening 2a alone.

Figure 8E:
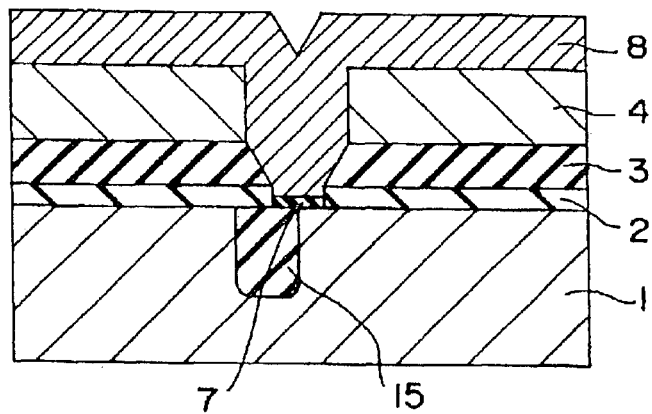

Subsequently, as shown in FIG. 8E, a conductive film 8 is deposited all over the surface. The trench 6 is buried with the conductive film 8. The insulation film 8 is made of such a material as polysilicon, W, TiW, SiGe, or Al, and has a thickness of, for example, 300 nm.

Figure 8F:
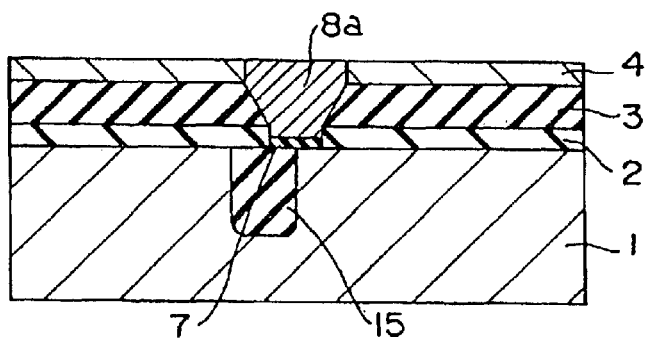

Next, as shown in FIG. 8F, the conductive film 8 on the insulation film 4 and approximately 100 nm of insulation film 4 are removed off by chemical mechanical polishing (CMP). Here, the conductive film 8 in the trench 6 is also polished to the same position as the insulation film 4, for overall planarization. As a result, the insulation film 4 is thinned to approximately 40 nm, and the gate electrode 8a of three-stage structure is formed.

Figure 8G:
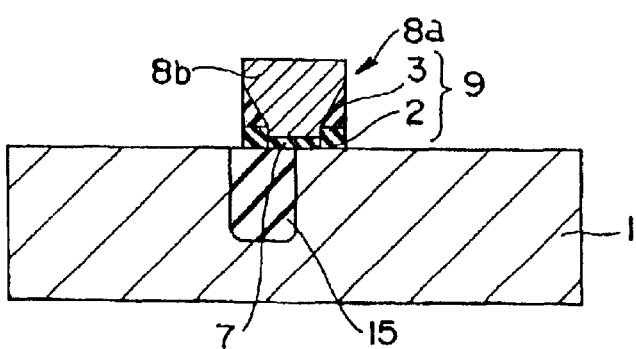

Then, as shown in FIG. 8G, the insulation films 4, 3, and 2 are etched with the gate electrode 8a as a mask. As a result, the portions of the insulation films 3 and 2 where covered with the visor part 8b of the gate electrode 8a are left exclusively. The left portions form the side walls 9 in a self-aligning fashion.

Figure 8H:
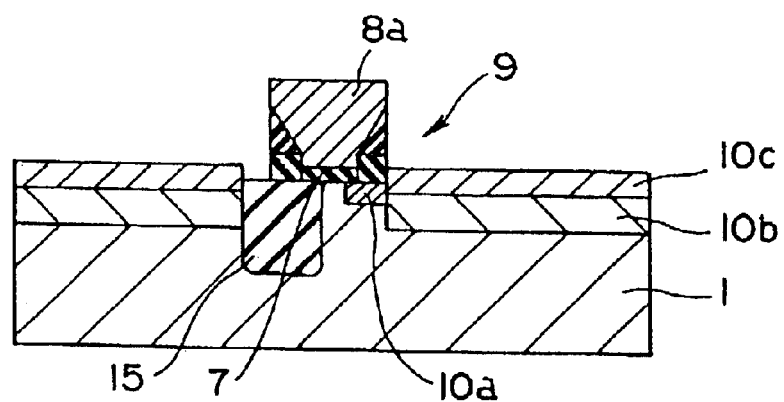

Thereafter, a pocket-region (not shown) for punch-through prevention is formed under the gate oxide film 7 by ion implantation from a slanting direction. In addition, as shown in FIG. 8H, a low concentration diffusion layer 10a is formed at the surface of the silicon substrate 1 beneath the insulation film 2 at a region where to form a diffusion layer, by ion implantation from a slanting direction. Subsequently, a high concentration diffusion layer 10b is formed at the exposed surface of the silicon substrate 1 by ion implantation. Furthermore, a refractory metal film (not shown) is deposited on the high concentration diffusion layer 10b. This refractory metal film is heated or otherwise brought into reaction with the silicon substrate 1 to form a silicide film 10c. The low concentration diffusion layer 10a, the high concentration diffusion layer 10b, and the silicide film 10c make a source/drain region of LDD structure. The refractory metal film is made of such a material as Ti, Co, Ni, Pt or the like.

Figure 8I:
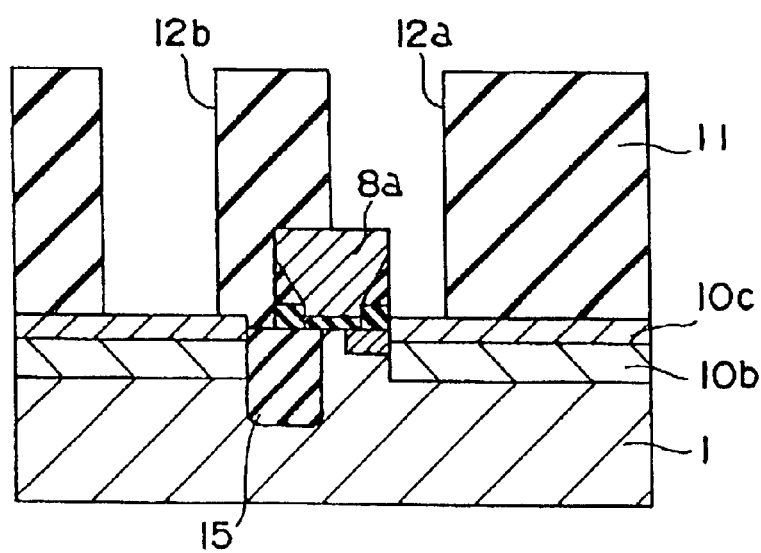

Next, as shown in FIG. 8I, an interlayer insulation film 11 is formed all over. A common contact hole 12a and a contact hole 12b are formed in this interlayer insulation film 11. The common contact hole 12a is formed at the borders between the gate electrodes 8a (the extremities of the extensions of the gate electrodes G2, G3) and the diffusion layers D4, D8 as the contact holes C4 and C8. The contact hole 12b is formed as the contact holes C1, C2, C3, C5, C6, C7, C9, C10, and C11. The common contact hole 12a and the contact hole 12b may be nearly equal in size.

Then, the common contact hole 12a and the contact hole 12b are buried with conductive films (not shown) of Al, Cu, or the like. A barrier film, wiring, and others (not shown) are formed thereon to complete the transistor by an ordinary method.

According to such a fabrication method, on the occasion when the common contact hole 12a and the contact hole 12b are formed in the interlayer insulation film 11, the side walls 9 are fully covered with the visor part 8b of the gate electrode 8a and therefore free from the etching. This prevents the decrease of the side walls 9, allowing a reduction in leak current. Moreover, since the side walls 9 can be formed in a self-aligning fashion using the visor part 8b as a mask, the number of steps can be reduced as compared to conventional methods of depositing an insulation film all over and etching back the same. Furthermore, even if the opening 5a is reduced to the minimum size processable by an exposure apparatus, the opening 2a can be made still smaller. This allows a gate length smaller than the exposure limit. In particular, in the present embodiment, at least the two insulation films 2 and 3 having different etching properties are laminated to form the side walls 9. Therefore, the tapered opening 3a of desired shape can be formed easily, achieving the gate electrode 8a of desired shape. As a result, it is possible to obtain MOS transistors of still faster operation.

In the method described above, the insulation film 4 has been formed on the insulation film 3. Nevertheless, the insulation film 4 may be omitted when the insulation film 3 may formed to a greater thickness of, for example, 220 nm.

In this case, after the formation of the opening 5a in the resist film 5, the insulation film 3 may be etched straight as much as 140 nm or so by using $CF_4$, for example. Then, the remainder of the insulation film 3 as thick as 80 nm or so may be etched into the tapered shape in the same conditions as in the foregoing method.

Moreover, as long as the gate electrode 8a of predetermined shape is obtainable, the insulation film 4 may be omitted while the insulation film 3 having a thickness of the order of 80 nm is topped with a resist film and etched into the tapered shape using this resist film as a mask. The resist film is then removed to form the conductive film 8. Nevertheless, in terms of securing the height of the gate electrode 8a and such, the insulation film 4 is preferably formed for CMP as in the method described above.

Furthermore, the insulation films 2, 3, and 4 are not limited to such materials as mentioned above, and may be made of any material as long as a predetermined etching selectivity can be obtained therebetween. For example, the insulation films 2 and 4 may be formed of nitride films while the insulation film 3 is of an oxide film. Even in this case, the insulation film 3 is preferably etched with $CHF_3$-containing gas.

What is claimed is:

1. A method of fabricating a semiconductor device comprising the steps of:
    forming first, second and third insulation films on a semiconductor substrate in succession;
    forming an opening in said third insulation film;
    forming an opening of tapered shape, narrowing with depth, in said second insulation film under a bottom of said opening in said third insulation film;
    forming an opening in said first insulation film consistent with a bottom shape of said opening in said second insulation film, and depositing a gate oxide film entirely therein;
    burying a conductive film into said openings formed in said first, second and third insulation films to form a gate electrode;
    planarizing a surface of said conductive film and said third insulation film; and
    etching said first, second and third insulation films with said conductive film used as a mask to form a side wall on a side surface of said gate electrode so as to be covered behind a top part of said gate electrode as seen in plain view.

2. The method of fabricating a semiconductor device according to claim 1, wherein said step of planarizing a surface is carried out by applying a chemical mechanical polishing to said surface.

3. The method of fabricating a semiconductor device according to claim 1, further comprising the steps of:
    implanting ions into a surface of said semiconductor substrate with said conductive film used as a mask to form a diffusion layer;
    forming an interlayer insulation film covering said conductive film and diffusion layer; and
    forming a common contact hole reaching said conductive film and said diffusion layer in said interlayer insulation film, a part of said common contact hole reaching said common conductive film and said diffusion layer.

4. The method of fabricating a semiconductor device according to claim 2, further comprising the steps of:
    implanting ions into a surface of said semiconductor substrate with said conductive film used as a mask to form a diffusion layer;
    forming an interlayer insulation film covering said conductive film and said diffusion layer; and
    forming a common contact hole reaching said conductive film and said diffusion layer in said interlayer insulation film, a part of said common contact hole reaching said common conductive film and said diffusion layer.

5. A method of fabricating a semiconductor device comprising the steps of:
    forming first, second and third insulation films on a semiconductor substrate in succession;
    forming an opening in said third insulation film;
    forming an opening of tapered shape, narrowing with depth, in said second insulation film under a bottom of said opening in said third insulation film;
    forming an opening in said first insulation film consistent with a bottom shape of said opening in said second insulation film, and depositing a gate oxide film only in said opening in said first insulation film;
    burying a conductive film into said openings formed in said first, second and third insulation films to form a gate electrode;
    planarizing a surface of said conductive film and said third insulation film; and
    etching said first, second and third insulation films with said conductive film used as a mask to form a side wall on a side surface of said gate electrode so as to be covered behind a top part of said gate electrode as seen in plain view.

6. The method of fabricating a semiconductor device according to claim 5, wherein said step of planarizing a surface is carried out by applying a chemical mechanical polishing to said surface.

7. The method of fabricating a semiconductor device according to claim 5, further comprising the steps of:
    implanting ions into a surface of said semiconductor substrate with said conductive film used as a mask to form a diffusion layer;
    forming an interlayer insulation film covering said conductive film and diffusion layer; and
    forming a contact hole reaching said conductive film and said diffusion layer in said interlayer insulation film, a part of said contact hole reaching said common conductive film and said diffusion layer.

8. The method of fabricating a semiconductor device according to claim 5, further comprising the steps of:
    implanting ions into a surface of said semiconductor substrate with said conductive film used as a mask to form a diffusion layer;
    forming an interlayer insulation film covering said conductive film and said diffusion layer; and
    forming a common contact hole reaching said conductive film and said diffusion layer in said interlayer insulation film, a part of said contact hole reaching said common conductive film and said diffusion layer.

* * * * *

UNITED STATES PATENT AND TRADEMARK OFFICE
CERTIFICATE OF CORRECTION

PATENT NO. : 6,841,472 B2
DATED : January 11, 2005
INVENTOR(S) : Mayuzumi

It is certified that error appears in the above-identified patent and that said Letters Patent is hereby corrected as shown below:

<u>Column 9,</u>
Line 63, delete the word "common".

<u>Column 10,</u>
Line 12, delete the word "common".

Signed and Sealed this

Thirty-first Day of May, 2005

JON W. DUDAS
*Director of the United States Patent and Trademark Office*